(12) United States Patent  (10) Patent No.: US 8,531,136 B2
Grajcar  (45) Date of Patent: Sep. 10, 2013

(54) ARCHITECTURE FOR HIGH POWER FACTOR AND LOW HARMONIC DISTORTION LED LIGHTING

(75) Inventor: Zdenko Grajcar, Crystal, MN (US)

(73) Assignee: Once Innovations, Inc., Plymouth, MN (US)

( * ) Notice: Subject to any disclaimer, the term of this patent is extended or adjusted under 35 U.S.C. 154(b) by 344 days.

(21) Appl. No.: 12/914,575

(22) Filed: Oct. 28, 2010

(65) Prior Publication Data

US 2011/0109244 A1    May 12, 2011

Related U.S. Application Data

(60) Provisional application No. 61/255,491, filed on Oct. 28, 2009.

(51) Int. Cl.
*H05B 37/00* (2006.01)

(52) U.S. Cl.
USPC .......... 315/318; 315/312; 315/294; 315/291; 315/194; 323/212; 323/300

(58) Field of Classification Search
USPC ............. 315/185 R, 194, 291, 294, 307, 312, 315/318, 320; 323/300, 320, 212
See application file for complete search history.

(56) References Cited

U.S. PATENT DOCUMENTS

| 5,495,147 | A | 2/1996 | Lanzisera | |
| 7,781,979 | B2 * | 8/2010 | Lys | 315/185 S |
| 7,902,769 | B2 * | 3/2011 | Shteynberg et al. | 315/291 |
| 8,102,167 | B2 * | 1/2012 | Irissou et al. | 323/300 |
| 2002/0047606 | A1 | 4/2002 | Guthrie et al. | |
| 2002/0097007 | A1 | 7/2002 | Koncz et al. | |
| 2002/0149929 | A1 | 10/2002 | Evans et al. | |
| 2007/0182338 | A1 | 8/2007 | Shteynberg et al. | |
| 2009/0160370 | A1 | 6/2009 | Tai et al. | |
| 2011/0210678 | A1 * | 9/2011 | Grajcar | 315/192 |
| 2011/0273098 | A1 * | 11/2011 | Grajcar | 315/186 |

FOREIGN PATENT DOCUMENTS

EP    2 094 063 A1    8/2009

OTHER PUBLICATIONS

International Preliminary Report on Patentability issued in PCT/US2010/054506 issued May 1, 2012.
International Search Repot issued in PCT/US2010/054506 issued on Dec. 28, 2010.
Todd Taylor., "Great Green Hope: The Corporate Love Affair with Algae", Biomass Magazine, Apr. 2010 Issue.

* cited by examiner

*Primary Examiner* — Haiss Philogene
(74) *Attorney, Agent, or Firm* — McDermott Will & Emery LLP

(57) ABSTRACT

Exemplary apparatus and associated methods involve a bypass module for modulating conductivity of one or more current paths to provide a first set of LEDs that are conducting near minimum output illumination and having a larger conduction angle than that of a second set of LEDs that conduct at a maximum output illumination. In an illustrative example, the conductivity of a bypass path in parallel with a portion of the second set of LEDs may be reduced while the AC input excitation is above a predetermined threshold voltage or current. The bypass path may be operated to provide a reduced effective turn-on voltage while the input excitation is below the predetermined threshold. For a given maximum output illumination at a maximum input excitation, the bypass module may control current through selected LEDs to construct an input current waveform with substantially improved power factor and reduced harmonic distortion.

18 Claims, 9 Drawing Sheets

| Power Quality | | | | | |
|---|---|---|---|---|---|
|  | Value | Mean | Min | Max | Std Dev |
| V RMS | 119.1V | 119.1 | 119.1 | 119.1 | 0.000 |
| V Crest Factor | 1.397 | 1.397 | 1.397 | 1.397 | 0.000 |
| Frequency | 60.00 Hz | 60.00 | 60.00 | 60.00 | 0.000 |
| I RMS | 38.21mA | 38.21m | 38.21m | 38.21m | 0.000 |
| I Crest Factor | 1.770 | 1.770 | 1.770 | 1.770 | 0.000 |
| True Power | 4.385 W | 4.385 | 4.385 | 4.385 | 0.000 |
| Apparent Power | 4.551 VA | 4.551 | 4.551 | 4.551 | 0.000 |
| Reactive Power | 1.218 VAR | 1.218 | 1.218 | 1.218 | 0.000 |
| Power Factor | 963.5m | 963.5m | 963.5m | 963.5m | 0.000 |
| Phase Angle | 15.53 | 15.53 | 15.53 | 15.53 | 0.000 |

ARCHITECTURE FOR HIGH POWER FACTOR AND LOW HARMONIC DISTORTION LED LIGHTING

CROSS-REFERENCE TO RELATED APPLICATIONS

This application claims priority to and the benefit of U.S. Provisional Patent Application entitled "Reduction of Harmonic Distortion for LED Loads," Ser. No. 61/255,491, which was filed by Z. Grajcar on Oct. 28, 2009, the entire contents of which are incorporated herein by reference.

TECHNICAL FIELD

Various embodiments relate generally to methods and apparatus for operating LEDs using alternating current (AC) excitation.

BACKGROUND

Power factor is important to utilities who deliver electrical power to customers. For two loads that require the same level of real power, the load with the better power factor actually demands less current from the utility. A load with a 1.0 power factor requires the minimum amount of current from the utility. Utilities may offer a reduced rate to customers with high power factor loads.

A poor power factor may be due to a phase difference between voltage and current. Power factor can also be degraded by distortion and harmonic content of the current. In some cases, distortion current waveforms tend to increase the harmonic energy content, and reduce the energy at the fundamental frequency. For a sinusoidal voltage waveform, only the energy at the fundamental frequency may transfer real power to a load. Distorted current waveforms can result from non-linear loads such as rectifier loads. Rectifier loads may include, for example, diodes such as LEDs, for example.

LEDs are becoming widely used devices capable of illumination when supplied with current. Typically, an LED is formed as a semiconductor diode having an anode and a cathode. In theory, an ideal diode will only conduct current in one direction. When sufficient forward bias voltage is applied between the anode and cathode, conventional current flows through the diode. Forward current flow through an LED may cause photons to recombine with holes to release energy in the form of light.

The emitted light from some LEDs is in the visible wavelength spectrum. By proper selection of semiconductor materials, individual LEDs can be constructed to emit certain colors (e.g., wavelength), such as red, blue, or green, for example.

In general, an LED may be created on a conventional semiconductor die. An individual LED may be integrated with other circuitry on the same die, or packaged as a discrete single component. Typically, the package that contains the LED semiconductor element will include a transparent window to permit the light to escape from the package.

SUMMARY

Exemplary apparatus and associated methods involve a bypass module for modulating conductivity of one or more current paths to provide a first set of LEDs that are conducting near minimum output illumination and having a larger conduction angle than that of a second set of LEDs that conduct at a maximum output illumination. In an illustrative example, the conductivity of a bypass path in parallel with a portion of the second set of LEDs may be reduced while the AC input excitation is above a predetermined threshold voltage or current. The bypass path may be operated to provide a reduced effective turn-on voltage while the input excitation is below the predetermined threshold. For a given maximum output illumination at a maximum input excitation, the bypass module may control current through selected LEDs to construct an input current waveform with substantially improved power factor and reduced harmonic distortion.

In various examples, the current modulation may extend an effective conduction angle of an input excitation current drawn from an electrical source.

In some examples, the modulation may draw an input excitation current constructed to substantially approximate a waveform and phase of a fundamental frequency of the input excitation voltage, which may result in an improved harmonic distortion and/or power factor. In an illustrative example, a turn-on voltage of an LED load may be reduced until the excitation input current or its associated periodic excitation voltage reaches a predetermined threshold level, and ceasing the turn-on voltage reduction while the excitation current or voltage is substantially above the predetermined threshold level.

Various embodiments may achieve one or more advantages. For example, some embodiments may be readily incorporated to provide improved electrical characteristics and/or dimming performance without redesigning existing LED modules. For examples, some embodiments can be readily implemented using a small number of discrete components in combination with existing LED modules. Some implementations may substantially reduce harmonic distortion on the AC input current waveform using, for example, very simple, low cost, and low power circuitry. In some embodiments, the additional circuitry to achieve substantially reduced harmonic distortion may include a single transistor, or may further include a second transistor and a current sense element. In some examples, a current sensor may be a resistive element through which a portion of an LED current flows. In some embodiments, significant size and manufacturing cost reductions may be achieved by integrating the harmonic improvement circuitry on a die with one or more LEDs controlled by harmonic improvement circuitry. In certain examples, harmonic improvement circuitry may be integrated with corresponding controlled LEDs on a common die without increasing the number of process steps required to manufacture the LEDs alone. In various embodiments, harmonic distortion of AC input current may be substantially improved for AC-driven LED loads, for example, using either half-wave or full-wave rectification.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is generally organized as follows. First, discussion with reference to FIG. 1 describes an exemplary context for dimmable AC LED lighting applications. The technology discussed with reference to FIGS. 2-6 may include examples of light engine circuits with a bypass embodiment that involves LEDs in a series arrangement. The technology discussed with reference to FIGS. 7-9 may include examples of light engine circuits with a bypass embodiment that involves LEDs in a parallel arrangement. The technology discussed with reference to FIG. 10 may include examples of light engine circuits with a bypass embodiment that involves LEDs in a combined series-parallel arrangement.

Figure 1:
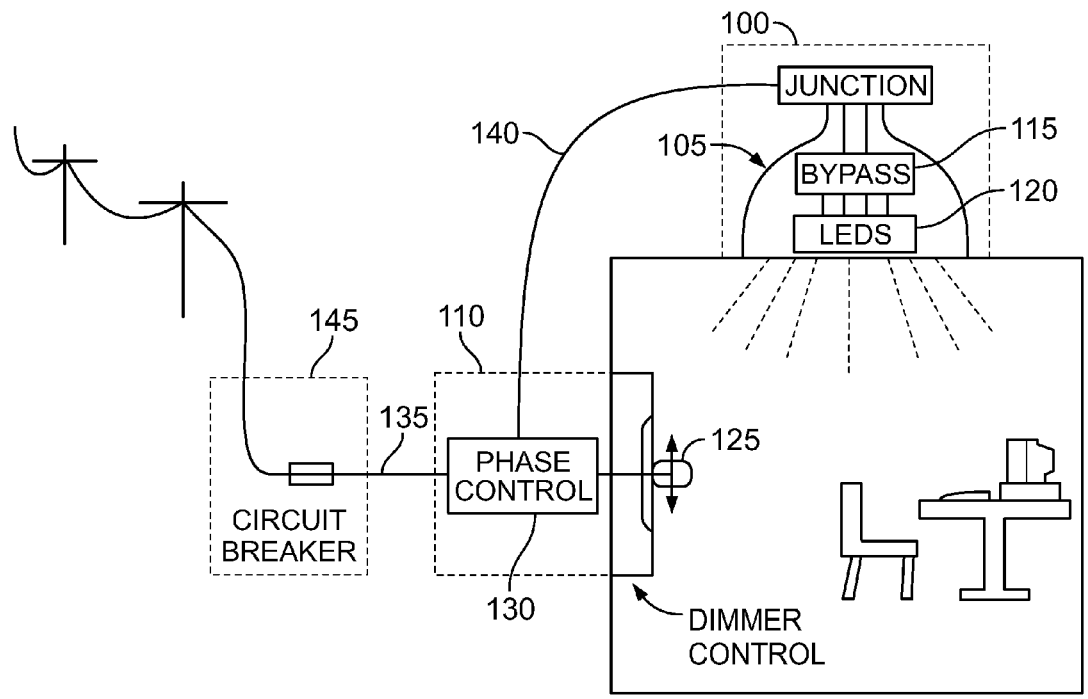
FIG. 1 depicts an illustrative downlight application with an exemplary LED-based light fixture.

FIG. 1 depicts an illustrative downlight application with an exemplary LED-based light fixture 100. In the depicted example, the fixture 100 is mounted to direct light substantially downward from a ceiling to illuminate an interior space in a building. The fixture 100 includes a light engine 105 that converts alternating current (AC) electrical excitation to light. The AC excitation supplied to the light engine 105 is controllable in response to user-adjustment of a dimmer module 110. The light engine 105 provides dimmable illumination while drawing current with substantially reduced harmonic distortion and at substantially improved power factor.

The light engine 105 includes a bypass module 115 and an LED module 120. Exemplary circuit implementations of the bypass module 115 and the LED module 120 are described, for example, with reference to FIG. 2, 5A-5B, 7A-7B, or 10A-10B. Generally, at low excitation levels, the bypass module 115 may configure itself in a first state to permit current to flow through a first set of LEDs on the LED module 120. At higher excitation levels, the bypass module 115 may configure itself to a second state to permit current to flow through a second set of LEDs on the LED module 120. In general, the first and second sets of LEDs share some LEDs in common, and the effective forward turn on voltage of the first set of LEDs is substantially lower than the effective forward turn-on voltage of the second set of LEDs.

For a given maximum output illumination at a maximum input excitation, the bypass module 115 may control the flow of current through selected LEDs on the LED module 120 so as to construct an input current waveform with substantially improved power factor and reduced harmonic distortion. Examples of input waveform construction are described in further detail with reference to FIGS. 6A, 8A-8B.

The dimmer module 110 includes a user input element 125 and a phase control module 130. A user can manipulate the user input element 125 to select any value in a range of values. The user input element 125 provides the selected user input value as a signal to the phase control module 130. The phase control module 130 receives an AC input 135 that may be excited by a substantially sinusoidal voltage source. The phase control module 130 outputs a modulated excitation output 140 based on the signal indicating the user-selected value.

In the depicted example, the phase control module 130 modulates the AC input 135 by use of phase control to block excitation during a portion of each cycle according to the user selected value. The phase control module 130 can modulate the AC excitation supplied to light engine 105 by adjusting the portion of the AC excitation waveform that is blocked from supply to the light engine.

As generally used herein for sinusoidal excitation, conduction angle refers to the portion (as measured in degrees) of a (180 degrees for a half-cycle) of a rectified sinusoidal waveform during which substantial excitation input current flows into the LED module 120. As an illustration, a resistive load may have a 180 degree conduction angle. A typical LED load may exhibit a conduction angle less than 180 degrees due to the forward turn-on voltage of each diode.

In an illustrative example, the AC input 135 may be excited with, for example, a nominally 120 Volt sinusoidal voltage at 60 Hz, but it is not limited to this particular voltage, waveform, or frequency. For example, some implementations may operate with AC input excitation of 115 Volts square wave at 400 Hz. In some implementations, the excitation may be substantially unipolar (rectified) sinusoidal, rectangular, triangular or trapezoidal periodic waveforms, for example. In various examples, the peak voltage of the AC excitation may be about 4, 6, 9, 12, 14, 16, 18, 20, 24, 28, 30, 32, 38, 42, 46, 50, 55, 60, 65, 70, 80, 90, 100, 110, 115, 120, 125, 130, 140, 150, 160, 170, 180, 190, 200, 210, 220, 230, 240, 260, 280, 300, 350, 400, 500, 600, 800, 1000, 1100, 1300, or at least about 1500 Volts.

The depicted dimmer module 110 operates in response to user input via a sliding control, which may be coupled to a potentiometer. In other embodiments, the user control input may be augmented or replaced with one or more other inputs. For example, the AC excitation supplied to the light engine 105 may be modulated in response to automatically generated analog and/or digital inputs, alone or in combination with input from a user. For example, a programmable controller may supply a control signal to establish an operating point for the dimmer control module 110.

The dimmer module 110 depicted in FIG. 1 includes a phase control module 130 to control what portion of the AC excitation waveform is substantially blocked from supply to the light engine 105. In other embodiments, the AC excitation may be modulated using one or more other techniques, either alone or in combination. For example, pulse-width modulation, alone or in combination with phase control, may be used to module the AC excitation at modulation frequency that is substantially higher than the fundamental AC excitation frequency.

In some examples, modulation of the AC excitation signal may involve a de-energized mode in which substantially no excitation is applied to the light engine 105. Accordingly, some implementations may include a disconnect switch (e.g., solid state or mechanical relay) in combination with the excitation modulation control (e.g., phase control module 130). The disconnect switch may be arranged in series to interrupt the supply connection of AC excitation to the light engine 105. In the example depicted in FIG. 1, a disconnect switch is depicted on a circuit breaker panel 145 that receives AC input from an electrical utility source and distributes the AC excitation 135 to the dimmer module 110. In some examples, the disconnect switch may be arranged at a different node in the circuit than the node in the circuit breaker panel 145. Some examples may include the disconnect switch arranged to respond to an automated input signal (e.g., from a programmable controller) and/or to the user input element 125 being placed into a predetermined position (e.g., moved to an end of travel position, pushed in to engage a switch, or the like).

Figure 2:
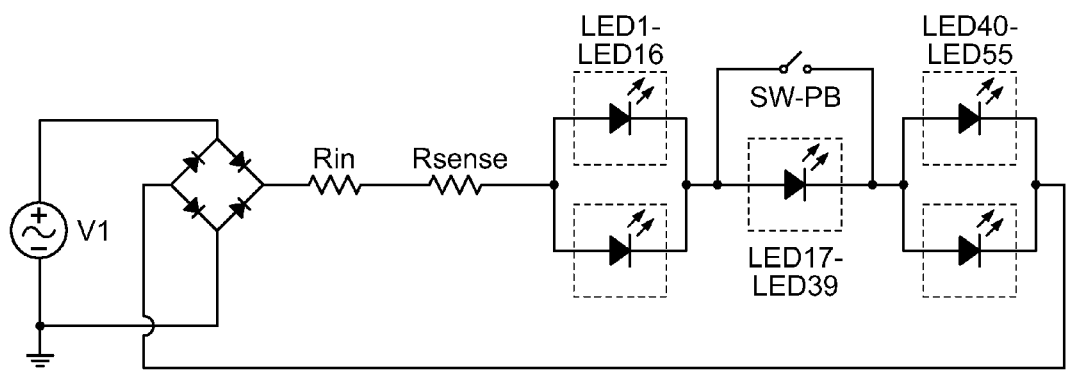
FIG. 2 shows a schematic of an exemplary circuit for an LED light engine with improved harmonic factor and/or power factor performance.

FIG. 2 shows a schematic of an exemplary circuit for an LED light engine with improved harmonic factor and/or power factor performance. The circuit includes a full wave rectifier Bridge1 that receives electrical power from a periodic voltage source V1, and supplies substantially unidirectional output current to a load circuit. The load circuit includes a current limiting resistor Rin, a current sense resistor Res1, a bypass switch SW-PB, and three LED groups.

A first LED group includes two parallel strings of eight LEDS each that are labeled as LED1-LED16. A second LED group in series with the first group includes two parallel strings of eight LEDS each that are labeled as LED40-LED55. A third group includes 22 series-connected LEDs labeled LED17-LED39. The third group is connected in series with the first and second groups of LEDs, and is further arranged in parallel with the bypass switch SW-PB. A circuit to operate the bypass switch SW-PB is not shown, but will be described in further detail with reference to FIG. 5, 7, or 10. Examples of circuits for controlling a bypass path are described, for example, with reference to FIG. 9 in U.S. Provisional Patent Application Ser. No. 61/233,829, entitled "Reduction of Harmonic Distortion for LED Loads," filed by Grajcar on Aug. 14, 2009, the entire contents of which are incorporated by reference.

In operation, the switch SW-PB is in a low impedance state at the beginning and end of each period while the AC input excitation current is below a predetermined threshold. While the switch SW-PB is in the low impedance state, the input current that flows through the first and second groups of LEDs is diverted along a path that is in parallel to the third group of LEDs. Accordingly, light emitted by the light engine while the AC input excitation is below the predetermined threshold is substantially only provided by the LEDs in the first and second groups. The bypass at low excitation levels around the third group of LEDs also substantially increases the conduction angle relative to the same circuit with the switch SW_PB removed.

The switch SW-PB transitions to a high impedance state as the AC input excitation current rises above the predetermined threshold. As the switch SW-PB transitions into the high impedance state, the input current that flows through the first and second groups of LEDs also begins to transition from flowing through the switch SW-PB to flowing through the third group of LEDs. Accordingly, light emitted by the light engine while the AC input excitation is above the predetermined threshold is substantially a combination of light provided by the LEDs in all three groups. The circuit currents and output luminance are described in further detail with reference to FIGS. 6A-6C.

In various examples, the first and second group LEDs 1-16 and 40-55 may include LEDs that emit a first color output, and the third group of LEDs 17-39 may include LEDs that emit at least a second color output when driven by a substantial current. In various examples, the number, color, and/or type of LED may be different.

By way of an illustrative example and not limitation, the first color may be substantially a warm color (e.g., blue or green) with a color temperature of about 2700-3000 K. The second color may be substantially a cool color (e.g., white) with a color temperature of about 5000-6000 K. With reference to the light fixture 100 of FIG. 1, some embodiments may advantageously smoothly transition the light fixture 100 output color from a cool (second) color to a warm (first) color as the AC excitation supplied to the light engine 105 is reduced, for example, by lowering a position of the user input element 125 on the dimmer control 110 of FIG. 1. Examples of circuits for providing a color shift are described, for example, with reference to FIGS. 20A-20C in U.S. Provisional Patent Application Ser. No. 61/234,094, entitled "Color Temperature Shift Control for Dimmable AC LED Lighting," filed by Grajcar on Aug. 14, 2009, the entire contents of which are incorporated by reference.

In one example assuming about 120 VAC operation, the first or second strings may each include about eight, nine, or ten LEDs in series, and the third string may include about 23, 21, or 20 LEDs, respectively. Various embodiments may be arranged with the appropriate resistance and number of series connected diodes to provide, for example, a desired output illumination using an acceptable peak current (e.g., at a peak AC input voltage excitation).

The conduction angles of the input current (which always flows through the first and second groups of LEDs) and the current in third group of LEDs are described in further detail with reference to FIG. 6A. The depicted implementation provides parallel branches of LEDs for the first sand second groups. In particular, LED1-LED8 are in parallel with LED9-LED16, and LED40-LED47 are in parallel with LED48-LED55. This parallel arrangement may advantageously substantially reduce an imbalance in the aging of the third group of LEDs relative to aging of the first and second groups of LEDS. Such an imbalance may arise, for example, where the conduction angle of current through the bypassed LEDs may be substantially less than the conduction angle of current through the first and second groups of LEDs. The first and second groups of LED conduct current substantially whenever AC excitation input current is flowing. In contrast, the third group of LEDs only conducts forward current when the bypass switch SW-PB is not routing substantially all of the input current through a path that is in parallel with the third group of LEDs.

The rectifier Bridge1 is depicted in FIG. 2 as a full bridge to rectify single phase AC excitation supplied from the voltage source V1. In this configuration, the rectifier Bridge1 rectifies both the positive and negative half-cycles of the AC input excitation to produce unidirectional voltage waveform with a fundamental frequency that is twice the input line excitation frequency. Accordingly, some implementations may reduce perceivable flicker by increasing the frequency at which the LED output illumination pulses. In some other embodiments, half or full wave rectification may be used. In some examples, rectification may operate from more than a single phase source, such as a 3, 4, 5, 6, 9, 12, 15 or more phase source.

Figures 3, 4A:
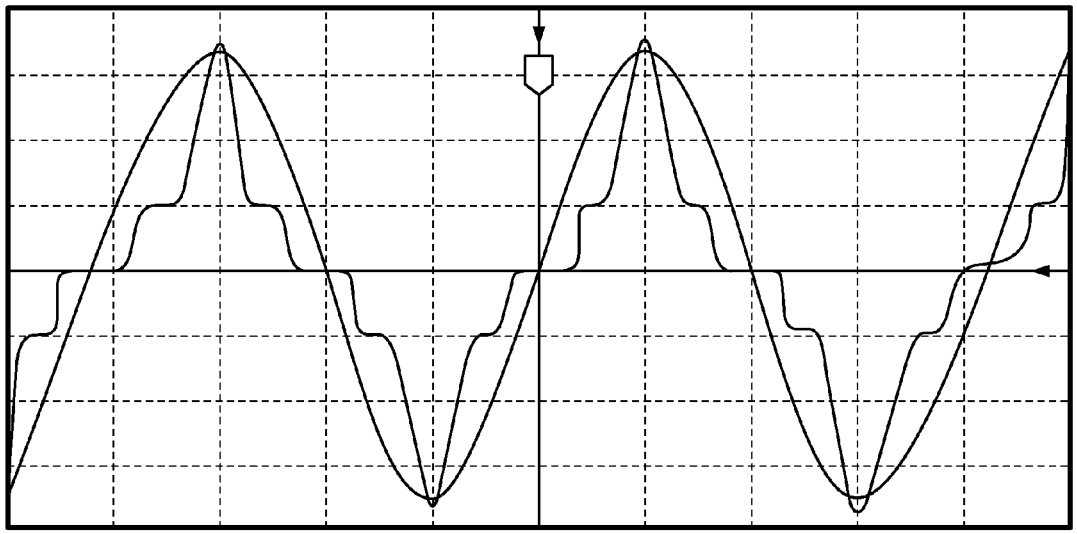
FIGS. 3 and 4A-4B depict experimental results collected by operation of the circuit substantially as shown and described with reference to FIG. 2.
Figure 4B:
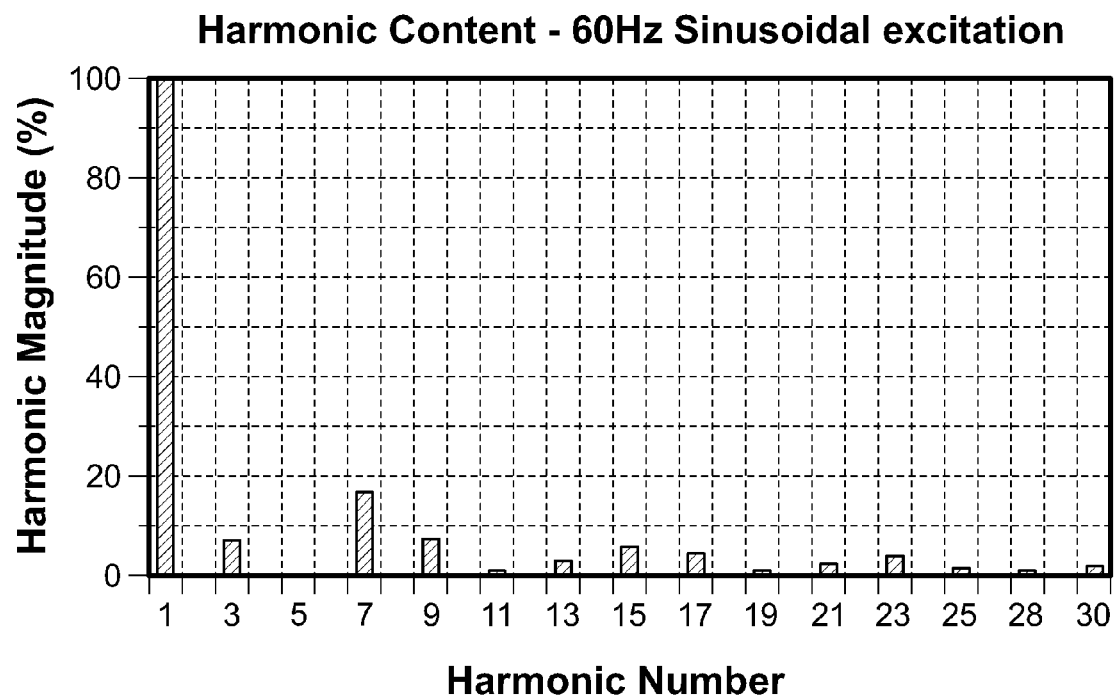

FIGS. 3 and 4A-4B depict experimental results collected by operation of the circuit substantially as shown and described with reference to FIG. 2.

The experimental set-up used LEDs model 40-01/T4C-4PRB, which are commercially available from Everlight Electronics of Taiwan, for all the LEDs. The applied excitation voltage was set sine wave at 120 Vrms and 60 Hz using an Agilent 6812B AC Power Source/Analyzer. Waveform plots and calculated power quality parameters for the input excitation voltage and current were made using a Tektronix DP03014 Digital Phospor oscilloscope with a DP03PWR module. The sense resistor was 23.3 Ohms, and the current limit resistor was 499 Ohms. The bypass switch SW-PB was a BSS123 n-channel mosfet.

The measured current waveform constructed using this experimental set-up is depicted in FIG. 3. The current waveform exhibits a head-and-shoulders shape. The shoulders correspond to current that flows through the bypass switch at low AC input excitation levels. At high AC input excitation levels, the current transitions to flow through all three groups of LEDs with increasing amplitude as the input excitation voltage rises to a peak.

FIG. 4A indicates that the power factor was measured to be 0.963. FIG. 4B depicts a harmonic profile with total harmonic distortion determined to be about 28.1%.

Figure 5A:
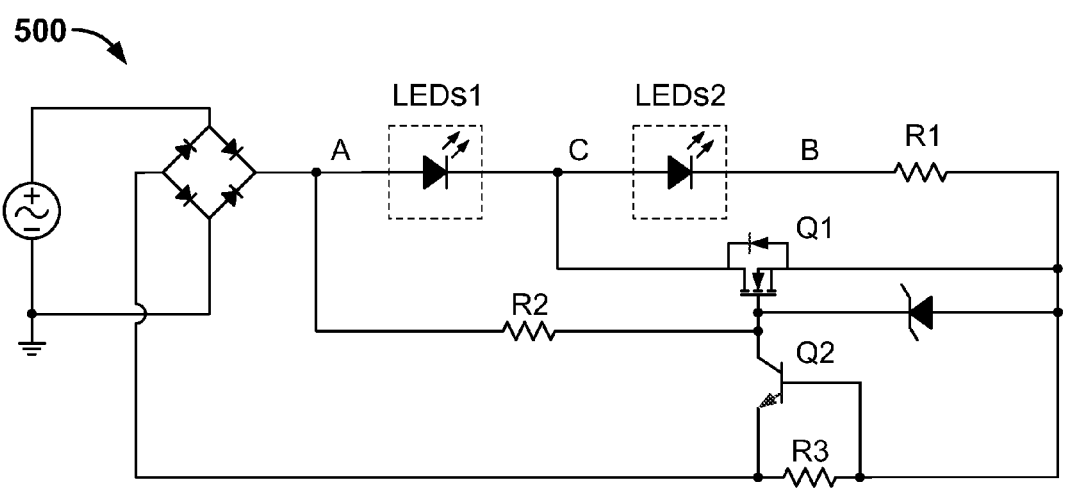
FIG. 5A shows a schematic of an exemplary circuit for an LED light engine with selective current diversion to bypass a group of LEDs while AC input excitation is below a predetermined level.

FIG. 5A shows a schematic of an exemplary circuit for an LED light engine with selective current diversion to bypass a group of LEDs while AC input excitation is below a predetermined level. Various embodiments may advantageously yield improved power factor and/or a reduced harmonic distortion for a given peak illumination output from the LEDs.

The light engine circuit of FIG. 5A includes a bridge rectifier and two groups of LEDs: LEDs1 and LEDs2 each contain multiple LEDs. In operation, each group of LEDs1, 2 may have an effective forward voltage that is a substantial fraction of the applied peak excitation voltage. Their combined forward voltage in combination with a current limiting element may control the forward current. The current limiting element may include, for example, a fixed resistor, current controlled semiconductor, temperature-sensitive resistors, or the like.

The light engine circuit further includes a bypass circuit that operates to reduce the effective forward turn-on voltage of the circuit. In various embodiments, the bypass circuit may contribute to expanding the conduction angle at low AC input excitation levels, which may tend to benefit power factor and/or harmonic factor, e.g., by constructing a more sinusoidally-shaped current waveform.

The bypass circuit includes a bypass transistor (e.g., MOSFET, IGBT, bipolar, or the like) with its channel connected in parallel with the LEDs2. The conductivity of the channel is modulated by a control terminal (e.g., gate of the MOSFET). In the depicted example, the gate is pulled up in voltage through a resistor to a positive output terminal of the rectifier, but can be pulled down to a voltage near a voltage of the source of the MOSFET by a collector of an NPN transistor. The NPN transistor may pull down the MOSFET gate voltage when a base-emitter of the NPN transistor is forward biased by sufficient LED current through a sense resistor.

The depicted example further includes an exemplary protection element to limit the gate-to-source voltage of the MOSFET. In this example, a zener diode (e.g., 14V breakdown voltage) may serve to limit the voltage applied to the gate to a safe level for the MOSFET.

Figure 5B:
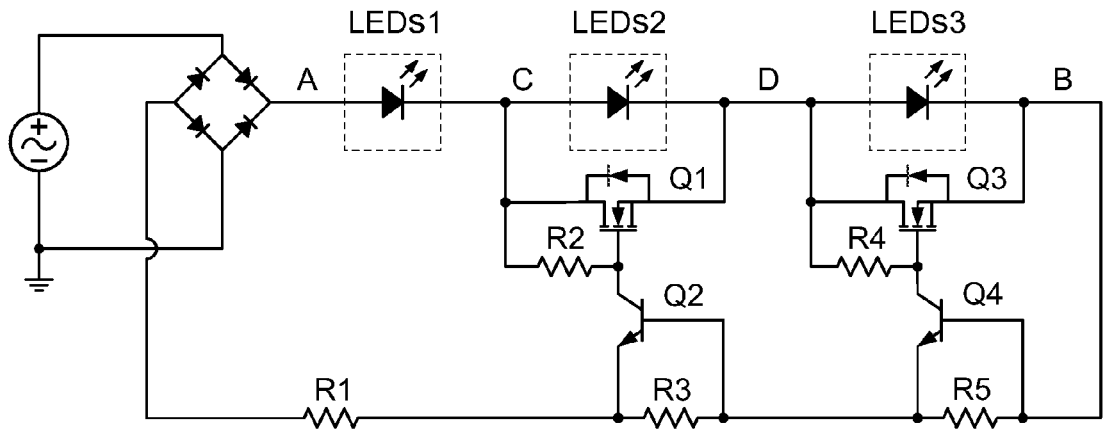
FIG. 5B depicts a schematic of an exemplary circuit for an LED light engine with selective current diversion to bypass two groups of LEDs while AC input excitation is below two corresponding predetermined levels.

FIG. 5B depicts a schematic of an exemplary circuit for an LED light engine with selective current diversion to bypass two groups of LEDs while AC input excitation is below two corresponding predetermined levels. The light engine circuit of FIG. 5B adds an additional group of LEDs and a corresponding additional bypass circuit to the light engine circuit of FIG. 5A. Various embodiments may advantageously provide for two or more bypass circuits, for example, to permit additional degrees of freedom in constructing a more sinusoidally-shaped current waveform. Additional degrees of freedom may yield further potential improvements to power factor and further reduced harmonic distortion for a given peak illumination output from the LEDs.

Figure 6A:
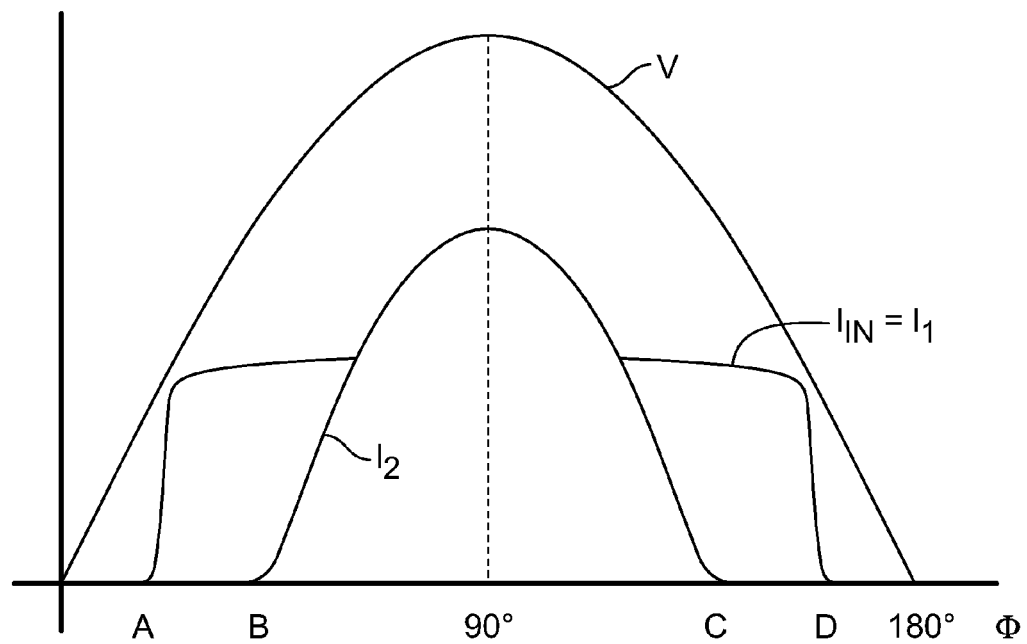
FIGS. 6A-6C depict exemplary electrical and light performance parameters for the light engine circuit of FIG. 5A.
Figure 6B:
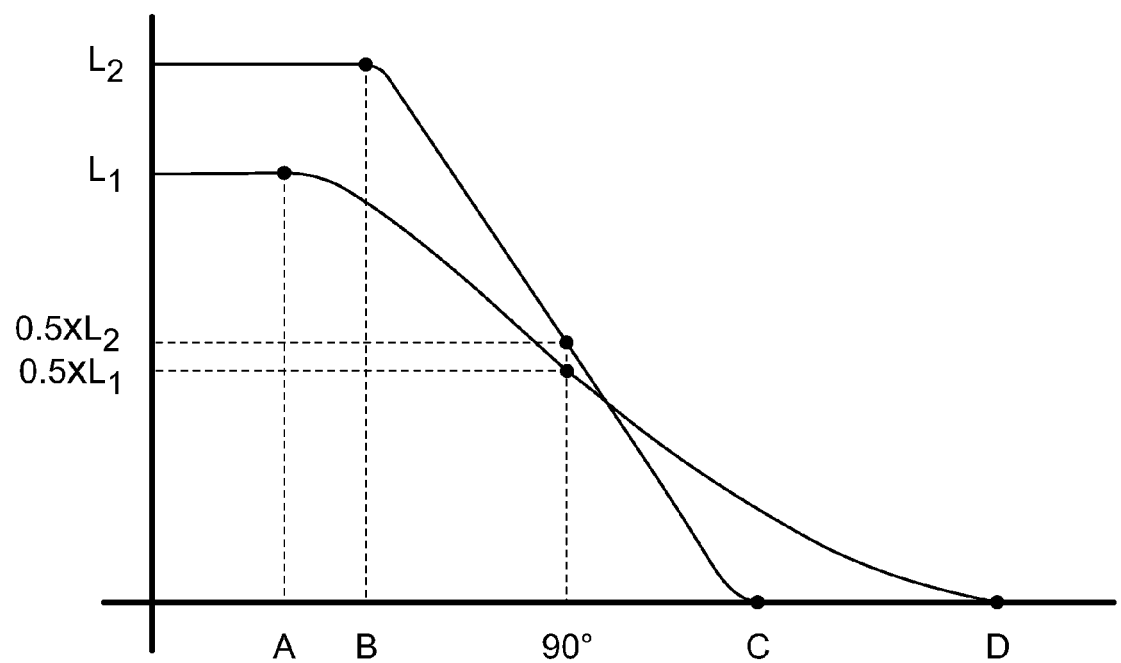
Figure 6C:
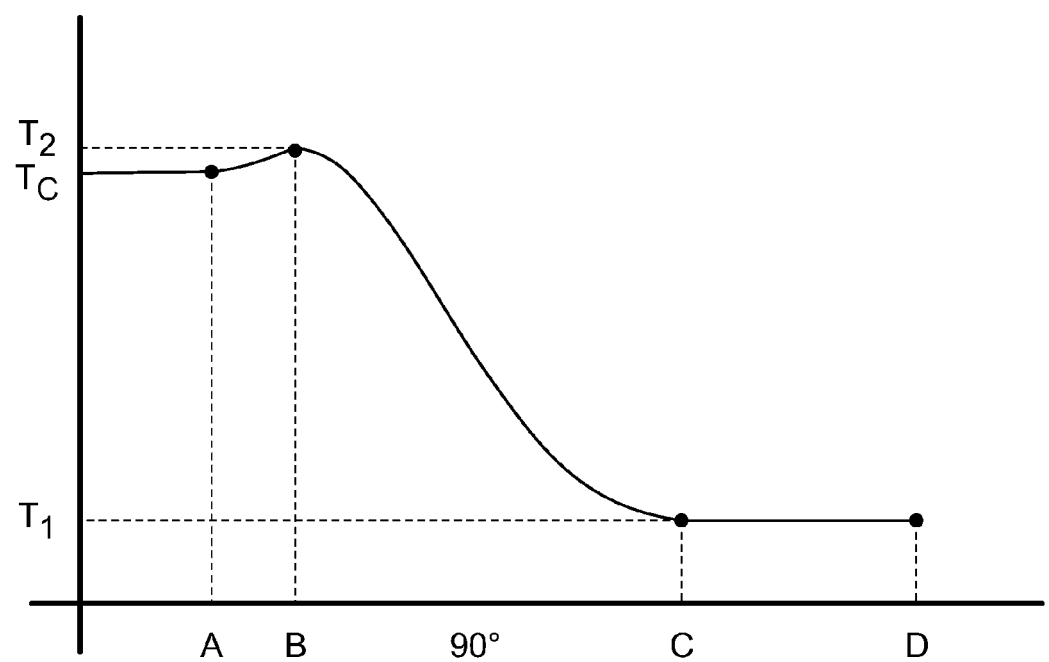

FIGS. 6A-6C depict exemplary electrical and light performance parameters for the light engine circuit of FIG. 5A.

FIG. 6A depicts illustrative voltage and current waveforms for the light engine circuit of FIG. 5A. The graph labeled V plots the AC input excitation voltage, which is depicted as a sinusoidal waveform. The plot labeled Iin=I1 shows an exemplary current waveform for the input current, which in this circuit, is the same as the current through LEDs1. A plot labeled I2 represents a current through the LEDs2.

During a typical half-cycle, LEDs1 do not conduct until the AC input excitation voltage substantially overcomes the effective forward turn on for the diodes in the circuit. When the phase reaches A in the cycle, current starts to flow through the LEDs1 and the bypass switch. Input current increase until the bypass circuit begins to turn off the MOSFET at B. In some examples, the MOSFET may behave in a linear region (e.g., unsaturated, not rapidly switching between binary states) as the current divides between the MOSFET channel and the LEDs2. The MOSFET current may fall to zero as the current I2 through LEDs2 approaches the input current. At the peak input voltage excitation, the peak light output is reached. These steps occur in reverse after the AC input excitation voltage passes its peak and starts to fall.

FIG. 6B depicts an illustrative plot of exemplary relationships between luminance of the LEDs1 and LEDs2 in response to phase control (e.g., dimming). The relative behavior of output luminance of each of LEDs1 and LEDs2 will be reviewed for progressively increasing phase cutting, which corresponds to dimming.

At the origin and up to conduction angle A, phase control does not attenuate any current flow through LEDs1 or LEDs2. Accordingly, the LEDs1 maintains its peak luminance L1, and the LEDs2 maintains its peak luminance L2.

When the phase control delays conduction for angles between A and B, an average luminance of LEDs1 is decreased, but the phase control does not impact the current profile through LEDs2, so LEDs2 maintains luminance L2.

When the phase control delays conduction for angles between B and C, an average luminance of LEDs1 continues to fall as the increase in phase cutting continues to shorten the average illumination time of the LEDs1. The phase control also begins to shorten the average conduction time of the LEDs2, so L2 luminance falls toward zero as the phase control turn-on delay approaches C.

When the phase control delays conduction for angles between C and D, the phase controller completely blocks current during the time the excitation input level is above the threshold required to turn off the bypass switch. As a consequence, LEDs2 never carries current and thus outputs no light. LEDs1 output continues to fall toward zero at D.

At phase cutting beyond D, the light engine puts out substantially no light because the excitation voltage levels supplied by the phase controller are not sufficient to overcome the effective forward turn on voltage of the LEDs1.

FIG. 6C depicts an exemplary composite color temperature characteristic under phase control for the LED light engine of FIG. 6A. In this example, LEDs1 and LEDs2 that have different colors, T1 and T2, respectively. The luminance behavior of LEDs1 and LEDs2 as described with reference to FIG. 6B indicates that an exemplary light engine can shift its output color as it is dimmed. In an illustrative example, the color temperature may shift from a cool white toward a warmer red or green as the intensity is dimmed by a simple exemplary phase control.

At the origin and up to conduction angle A, phase control does not attenuate the illuminance of LEDs1 or LEDs2. Accordingly, the light engine may output a composite color temperature that is a mix of the component color temperatures according to their relative intensities.

When the phase control delays conduction for angles between A and B, an average luminance of the LEDs2 may be maintained substantially constant while the luminance of the LEDs1 modulates in substantial correspondence with modulation of the phase. An average color temperature increases as the luminance of the low color temperature LEDs1 is decreased (see FIG. 6B).

When the phase control delays conduction for angles between B and C, the color temperature falls relatively rapidly as the increased phase cutting attenuates the higher color temperature toward zero. In this range, the lower color temperature LEDs1 falls relatively slowly, but not to zero.

When the phase control delays conduction for angles between C and D, the only contributing color temperature is T1, so the color temperature remains constant as the luminance of LEDs1 falls toward zero at D.

The example of FIG. 6C may cover embodiments in which the different color LEDs are spatially oriented and located to yield a composite color output. By way of an example, multiple colors of LEDs may be arranged to form a beam in which the illumination from each LED color substantially shares a common orientation and direction with other colors.

In some other embodiments, different color LEDs may be behave substantially as described in FIGS. 6A and 6B, yet may be spatially oriented so that their output illumination does not form a composite color that responds according to FIG. 6C. As an illustration, an exemplary light fixture may include LEDs1 and LEDs 2 that are spatially oriented to direct their illumination in orthogonal directions. By way of example and not limitation, one color of LEDs may be oriented downward from a ceiling toward the floor, and another color of LEDs may be oriented radially in a plane parallel to the floor. Accordingly, an exemplary shift in light engine color output may appear to have a spatial component.

In light of the foregoing, it may be seen that composite color temperature may be manipulated by controlling current flow through or diverting away from groups of LEDs. In various examples, manipulation of current flow through groups of LEDs may be automatically performed by one or more bypass circuits that are configured to be responsive to AC excitation levels. Moreover, various embodiments have been described that selectively divert current to improve power factor and/or reduce harmonic distortion, for example, for a given peak output illumination level. Bypass circuits have been described herein that may be advantageously implemented with existing LED modules or integrated into an LED module to form an LED light engine with only a small number of components, with low power, and low overall cost.

Accordingly, it may be appreciated from the disclosure herein that color temperature shifting may be implemented or designed based on appropriate selection of diode groups. The selection of number of diodes in each group, excitation voltage, phase control range, diode colors, and peak intensity parameters.

Figure 7A:
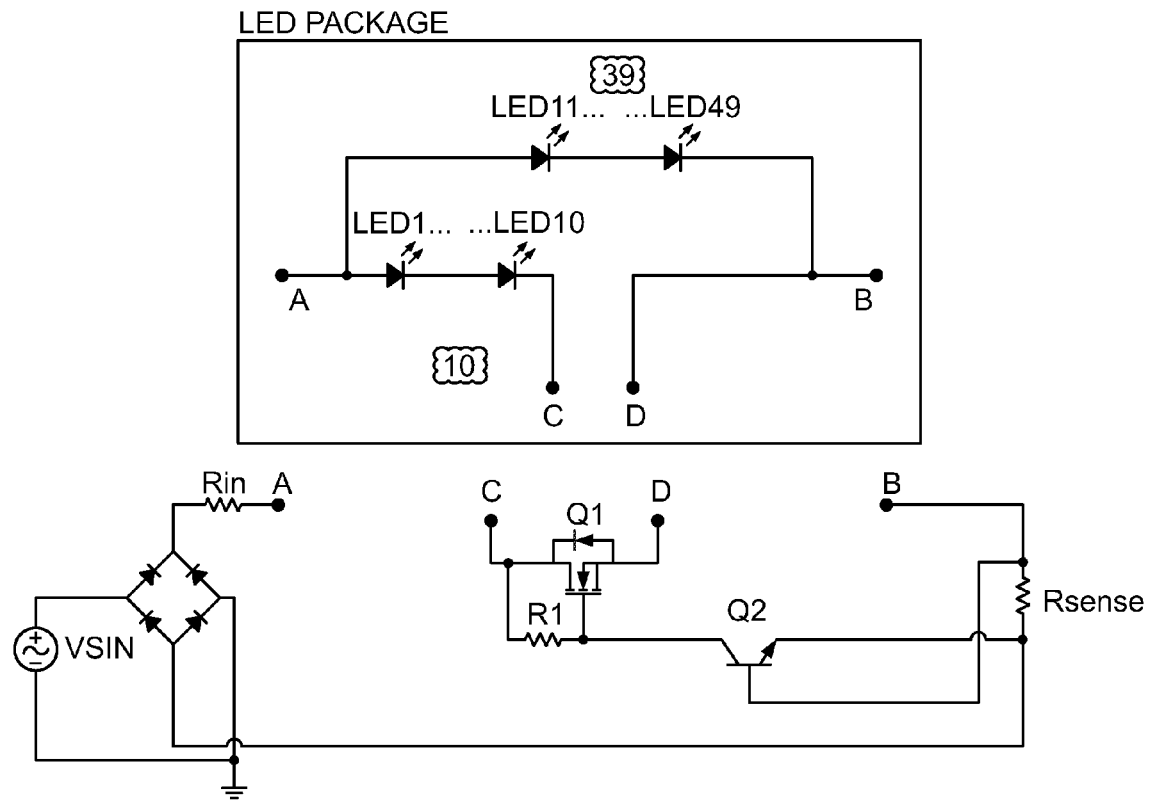
FIG. 7A shows a schematic of another exemplary circuit for an LED light engine with selective current diversion to bypass a group of LEDs while AC input excitation is below a predetermined level.

FIG. 7A shows a schematic of another exemplary circuit for an LED light engine with selective current diversion to bypass a group of LEDs while AC input excitation is below a predetermined level. The schematic depicted in FIG. 7A includes one embodiment of a bridge rectifier, a current limiting resistor, and bypass circuit substantially as described above with reference to FIG. 5A.

The schematic of FIG. 7A further includes two parallel paths that both include a number of LEDs arranged in series within an LED package with terminals A-D. In some implementations, an LED package may be referred to as an integrated circuit or module. One of the parallel paths in the LED package includes 10 LEDs labeled LED1-LED10 and arranged in series between the terminal A and the terminal C. Another of the parallel paths in the LED package includes 39 LEDs labeled LED11-LED49 and arranged in series between the terminal A and the terminal B. The terminal B is directly coupled (e.g., electrical short circuit) to the terminal D. When connected to the LED module, current from the positive terminal of the bridge rectifier flows into the terminal A of the LED package.

In this example, the 10 LED path provides a relatively low effective forward turn on voltage, allowing input current to flow at relatively low input excitation voltages. At high input excitation levels, only the 39 LED path is conducting current and providing peak output illumination.

In the embodiment depicted in FIG. 7A, the bypass circuit includes an re-channel MOSFET as transistor Q1. A gate of the transistor Q1 is controlled by an NPN type bipolar junction transistor Q2.

Figure 8A:
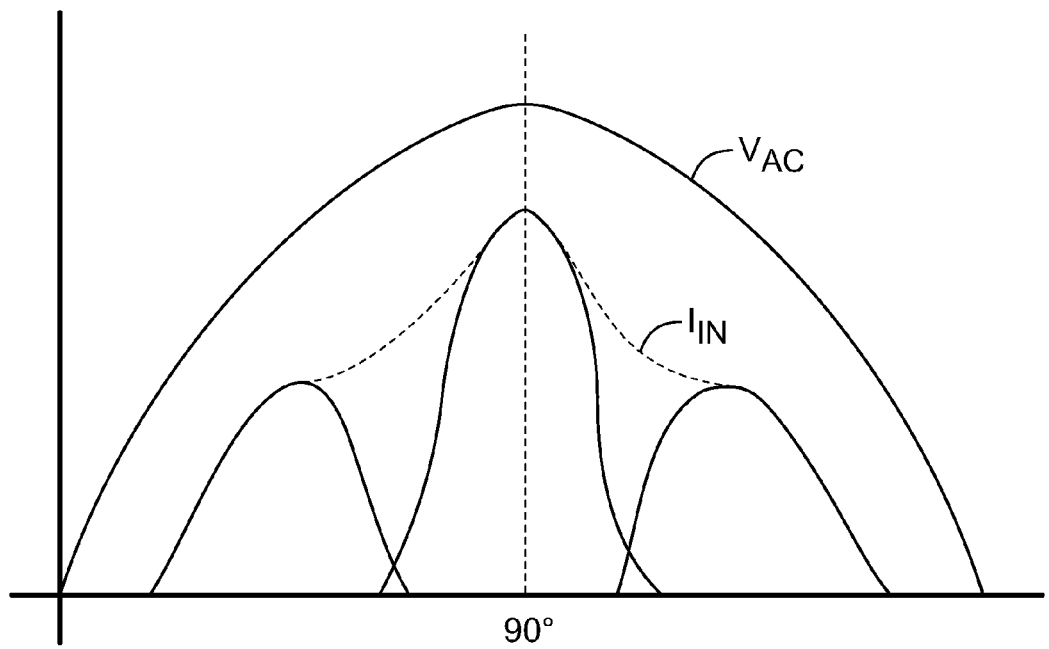
FIG. 8A depicts a plot of exemplary current through parallel LED paths of the circuit of FIG. 7A.

FIG. 8A depicts a plot of exemplary current through parallel LED paths of the circuit of FIG. 7A. At low AC excitation levels below a predetermined threshold, a transistor Q1 in the bypass circuit permits current to flow through the 10 series LEDs LED1-LED10. The predetermined threshold may be determined, for example, by the current sense resistor, Rsense, and operation of the bypass circuit. As the current through the resistor Rsense increases sufficiently to cause the channel conductivity of transistor Q1 to fall, the input excitation voltage in some embodiments may be sufficient to conduct current through the LEDs labeled LED11-LED49. The input current drawn from the AC excitation source may be formed substantially as a combination of the currents in each of the parallel paths.

Figure 7B:
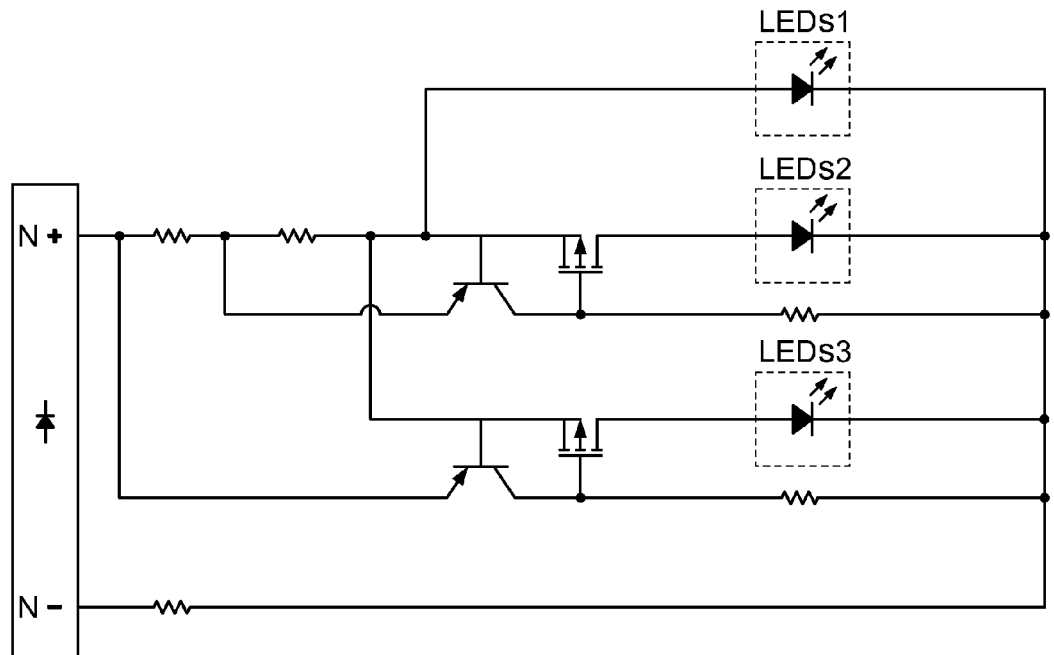
FIG. 7B shows a schematic of another exemplary circuit for an LED light engine with selective current diversion to bypass a group of LEDs while AC input excitation is below a predetermined level.

FIG. 7B shows a schematic of another exemplary circuit for an LED light engine with selective current diversion to bypass a group of LEDs while AC input excitation is below a predetermined level. The schematic depicted in FIG. 7B includes one embodiment of a bridge rectifier, current limiting resistor, and two parallel LED paths, one of which is interruptible by a bypass circuit substantially as described above with reference to FIG. 7A.

The schematic of FIG. 7B further includes a third parallel path that includes another group of LEDs that is interruptible by a bypass circuit. In the embodiment depicted in FIG. 7B, the bypass circuits include a p-channel MOSFET as the bypass transistor. A gate of the bypass transistor is controlled by a PNP type bipolar junction transistor. The PNP transistor are arranged to respond to current through two current sense resistors. In this example, the bypass circuit for the LEDs3 turns off at a lower excitation threshold than the corresponding threshold at which the LEDs2 turns off.

Figure 8B:
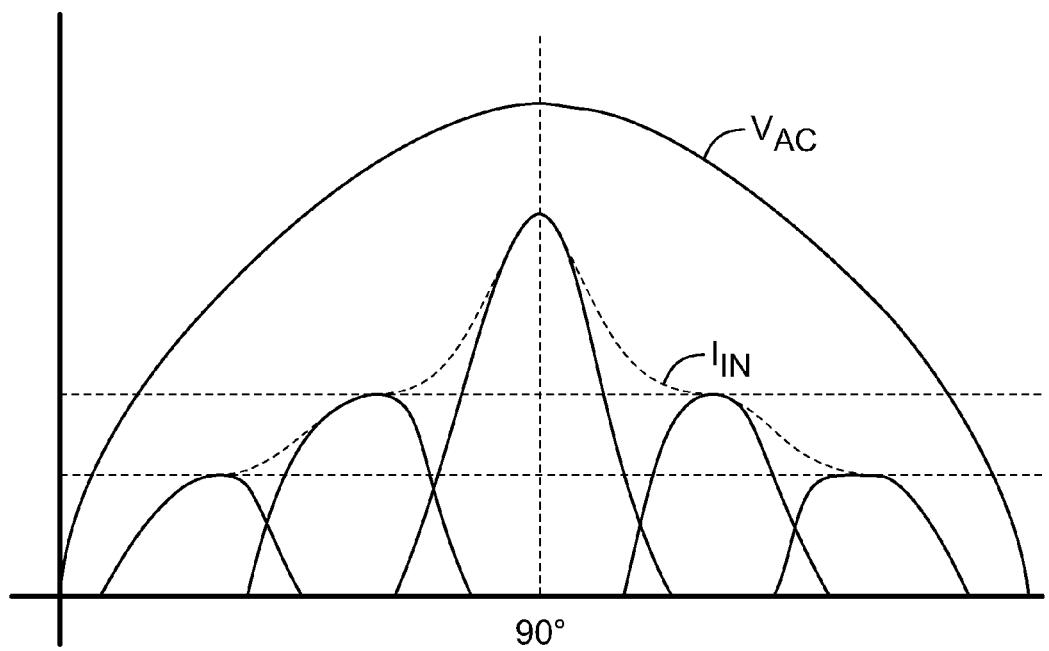
FIG. 8B depicts a plot of exemplary current through parallel LED paths of the circuit of FIG. 7B.

FIG. 8B depicts a plot of exemplary current through parallel LED paths of the circuit of FIG. 7B. At low AC excitation levels below a first predetermined threshold, a transistor in the bypass circuit LEDs3 permits current to flow through the LEDs3. As the current through the resistor increases sufficiently to cause the channel conductivity of that transistor to fall, the input excitation voltage in some embodiments may be sufficient to conduct current through the LEDs2.

At some low AC excitation levels below a second predetermined threshold, a transistor in the bypass circuit LEDs2 permits current to flow through the LEDs2. As the current through one of the current sense resistors increases sufficiently to cause the channel conductivity of that transistor to fall, the input excitation voltage in some embodiments may be sufficient to conduct current through the LEDs1.

In this example, the LEDs3 path provides a relatively low effective forward turn on voltage, allowing input current to flow at relatively low input excitation voltages. The LEDs2 path provides a relatively intermediate effective forward turn on voltage, allowing input current to flow at intermediate input excitation voltages. At high input excitation levels, only the LEDs1 path is conducting current and providing peak output illumination.

Figure 9A:
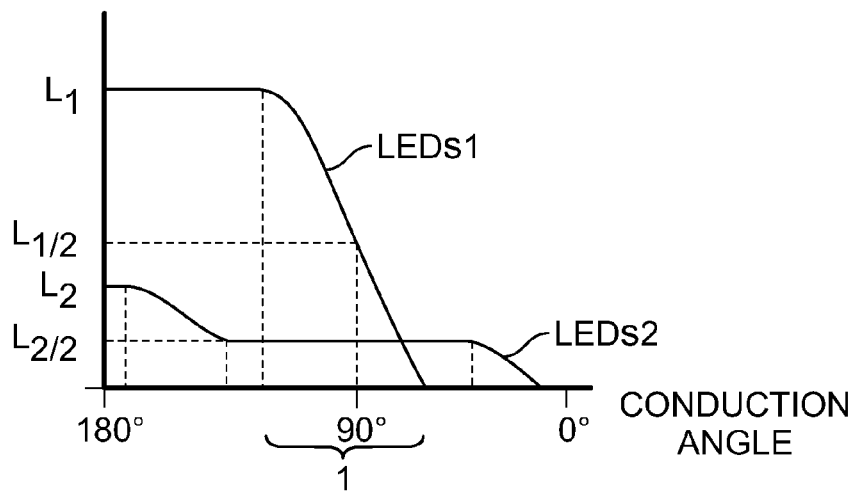
FIG. 9A depicts an illustrative plot of exemplary relationships between luminance of each group of LEDs in FIG. 7A in response to phase control (e.g., dimming).

FIG. 9A depicts an illustrative plot of exemplary relationships between luminance of each group of LEDs in FIG. 7A in response to phase control (e.g., dimming). The plot depicted in FIG. 9A includes a plot of the luminance of the 39 LEDs LED11-LED49, which may be substantially as described above with reference to L2 in FIG. 6B.

The illustrative plot of FIG. 9A further includes a luminance of the LED1-LED10 over a range of phase control angles. At low phase control angles, the luminance is depicted as L2. As the phase control angle increases through the angles at which the transistor Q1 is conducting and the excitation voltage is rising, the luminance falls to a value that is one-half of the value of the luminance L2. At phase control angles at which only the LEDs11-LEDs49 are conducting, the luminance of the 10 LEDs maintains its value at one-half of L2. As the phase control angle increases through the angles at which the transistor Q1 is conducting and the excitation voltage is falling, the luminance of the 10 LEDs falls to zero.

Figure 9B:
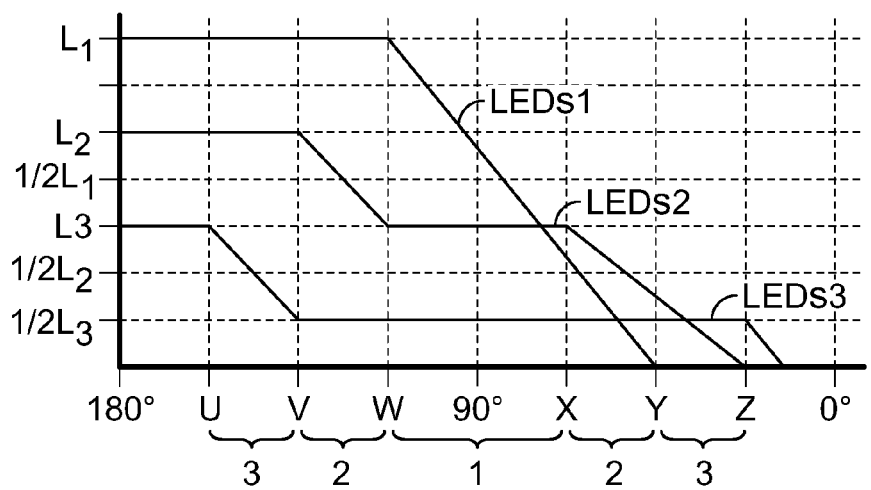
FIG. 9B depicts an illustrative plot of exemplary relationships between luminance of each group of LEDs in FIG. 7B in response to phase control (e.g., dimming).

FIG. 9B depicts an illustrative plot of exemplary relationships between luminance of each group of LEDs in FIG. 7B in response to phase control (e.g., dimming). The plot depicted in FIG. 9B includes a plot of the luminance of the LEDs1, which may be substantially as described above with reference to the plot of LEDs 1 in FIG. 9A. The plot depicted in FIG. 9B includes a plot of the luminance of the LEDs2, which may be substantially as described above with reference to the plot of LEDs2 in FIG. 9A.

The illustrative plot of FIG. 9B further includes a plot of the luminance of the LEDs3, which may be substantially as the plot of LEDs2 as described above with reference to FIG. 9A, but with lower predetermined threshold above which the bypass transistor in series with the LEDs3 may turn off.

Figure 9C:
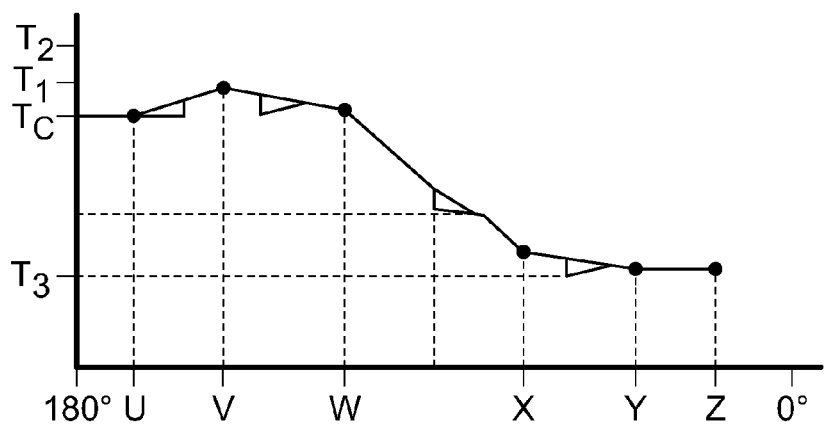
FIG. 9C depicts an exemplary composite color temperature characteristic under phase control for the LED light engine of FIG. 7B.

FIG. 9C depicts an exemplary composite color temperature characteristic under phase control for the LED light engine of FIG. 7B. The color temperature may be formed based on the luminance plots of FIG. 9B substantially in the manner described above with reference to FIG. 6C.

FIG. 9C depicts an exemplary composite color temperature characteristic under phase control for the LED light engine of FIG. 7B.

Figure 10A:
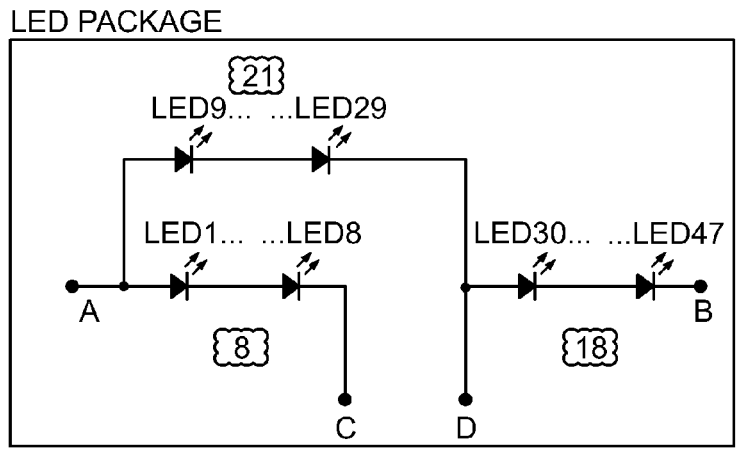
FIGS. 10A and 10B show schematics of further exemplary circuits for an LED light engine with selective current diversion to bypass a group of LEDs while AC input excitation is below a predetermined level.
Figure 10A:
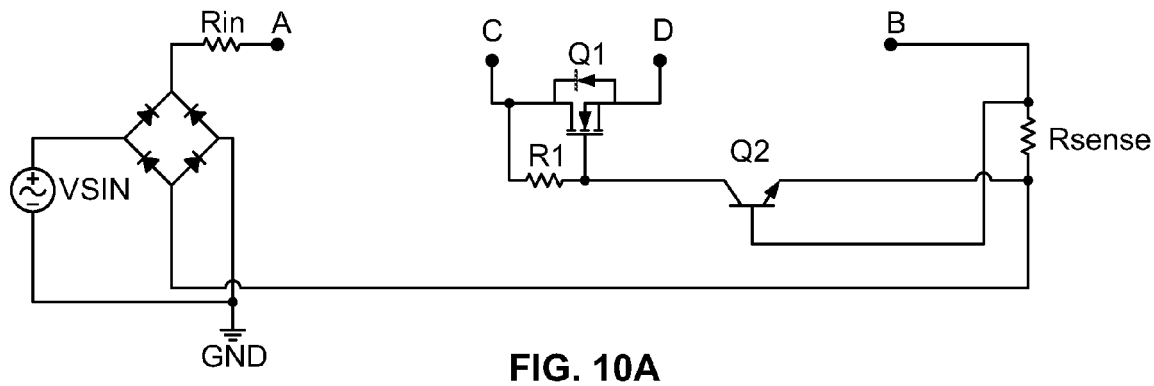
Figure 10B:
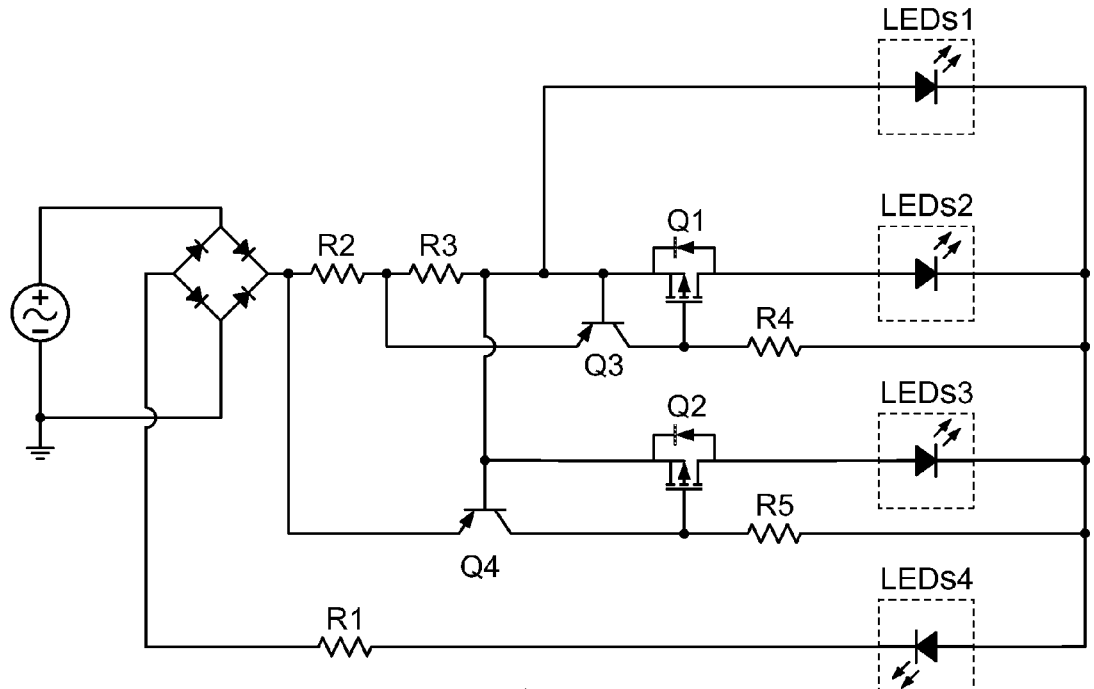

FIGS. 10A and 10B show schematics of further exemplary circuits for an LED light engine with selective current diversion to bypass a group of LEDs while AC input excitation is below a predetermined level.

The schematic depicted in FIG. 10A include one embodiment of a bridge rectifier, current limiting resistor, and two parallel LED paths, one of which is interruptible by a bypass circuit substantially as described above with reference to FIG. 7A.

The schematic of FIG. 10A further includes a third LED group. Instead of a short circuit between terminals B and D, as described with reference to FIG. 7A, the LED package of FIG. 10A further includes 18 LEDs labeled LED30-LED47 in series with the input current path. In the depicted example, 21 LEDs are series connected between the terminals A and D, and 8 LEDs are connected in series between the terminals A and C.

The schematic depicted in FIG. 10B includes the circuit substantially as described above with reference to FIG. 10A.

The schematic of FIG. 10B further includes a third parallel path that includes another group of LEDs that is interruptible by a bypass circuit. In the embodiment depicted in FIG. 10B, the bypass circuits include a p-channel MOSFET as the bypass transistor. A gate of the bypass transistor is controlled by a PNP type bipolar junction transistor. The PNP transistors are arranged to respond to current through two current sense resistors. In this example, the bypass circuit for the LEDs3 turns off at a lower excitation threshold than the corresponding threshold at which the LEDs2 turns off.

Although various embodiments have been described with reference to the figures, other embodiments are possible. For example, some bypass circuits implementations may be controlled in response to signals from analog or digital components, which may be discrete, integrated, or a combination of each. Some embodiments may include programmed and/or programmable devices (e.g., PLAs, PLDs, ASICs, microcontroller, microprocessor, digital signal processor (DSP)), and may include one or more data stores (e.g., cell, register, block, page) that provide single or multi-level digital data storage capability, and which may be volatile and/or non-volatile. Some control functions may be implemented in hardware, software, firmware, or a combination of any of them.

In some embodiments, materials selection and processing may be controlled to manipulate the LED color temperature and other light output parameters (e.g., intensity, direction) so as to provide LEDs that will produce a desired composite characteristic. Appropriate selection of LEDs to provide a desired color temperature, in combination with appropriate application and threshold determination for the bypass circuit, can advantageously permit tailoring of color temperature variation over a range of input excitation.

In an illustrative embodiment, a rectifier may receive an AC (e.g., sinusoidal) voltage and deliver substantially unidirectional current to LED modules arranged in series. An effective turn-on voltage of the LED load may be reduced by diverting current around at least one of the diodes in the string while the AC input voltage is below a predetermined level. In various examples, selective current diversion within the LED string may extend the input current conduction angle and thereby substantially reduce harmonic distortion for AC LED lighting systems.

Computer program products may contain a set of instructions that, when executed by a processor device, cause the processor to perform prescribed functions. These functions may be performed in conjunction with controlled devices in operable communication with the processor. Computer program products, which may include software, may be stored in a data store tangibly embedded on a storage medium, such as an electronic, magnetic, or rotating storage device, and may be fixed or removable (e.g., hard disk, floppy disk, thumb drive, CD, DVD).

Various embodiments may provide reduced perceptible flicker to humans or animals by operating the LEDs to carry unidirectional current at twice the AC input excitation frequency. For example, a full-wave rectifier may supply 100 or 120 Hz load current (rectified sine wave), respectively, in response to 50 or 60 Hz sinusoidal input voltage excitation. The increased load frequency produces a corresponding increase in the flicker frequency of the illumination, which tends to push the flicker energy toward or beyond the level at which it can be perceived by humans or some animals. This may advantageously reduce stress related to flickering light.

In some embodiments, implementations may be integrated with other elements, such as packaging and/or thermal management hardware. Examples of thermal other elements that may be advantageously integrated with the embodiments described herein are described with reference, for example, to FIG. 15 in U.S. Publ. Application 2009/0185373 A1, filed by Z. Grajcar on Nov. 19, 2008, the entire contents of which are incorporated herein by reference.

In accordance with another embodiment, additional components may be included, for example, to reduce reverse leakage current through the diodes. For example, a low reverse leakage rectifier that is not an LED may be included in series with both branches of the rectifier to minimize reverse leakage in the positive and negative current paths in the rectifier.

In accordance with another embodiment, AC input to the rectifier may be modified by other power processing circuitry. For example, a dimmer module that uses phase-control to delay turn on and/or interrupt current flow at selected points in each half cycle may be used. In some cases, harmonic improvement may still advantageously be achieved even when current is distorted by the dimmer module. Improved power factor may also be achieved where the rectified sinusoidal voltage waveform is amplitude modulated by a dimmer module, variable transformer, or rheostat, for example.

In one example, the excitation voltage may have a substantially sinusoidal waveform, such as line voltage at about 120VAC at 50 or 60 Hz. In some examples, the excitation voltage may be a substantially sinusoidal waveform that has been processed by a dimming circuit, such as a phase-controlled switch that operates to delay turn on or to interrupt turn off at a selected phase in each half cycle. In some examples, the dimmer may modulate the amplitude of the AC sinusoidal voltage (e.g., AC-to-AC converter), or modulate an amplitude of the rectified sinusoidal waveform (e.g., DC-to-DC converter).

In some implementations, a computer program product may contain instructions that, when executed by a processor, cause the processor to adjust the color temperature, luminance and/or intensity of lighting, which may include LED lighting. Color temperature may be manipulated by a composite light apparatus that combines one or more LEDs of one or more color temperatures with one or more non-LED light sources, each having a unique color temperature and/or light output characteristic. By way of example and not limitation, multiple color temperature LEDs may be combined with one or more fluorescent, incandescent, halogen, and/or mercury lights sources to provide a desired color temperature characteristic over a range of excitation conditions.

In some implementations, the amplitude of the excitation voltage may be modulated, for example, by controlled switching of transformer taps. In general, some combinations of taps may be associated with a number of different turns ratios. For example, solid state or mechanical relays may be used to select from among a number of available taps on the primary and/or secondary of a transformer so as to provide a turns ratio nearest to a desired AC excitation voltage.

In some examples, AC excitation amplitude may be dynamically adjusted by a variable transformer (e.g., variac) that can provide a smooth continuous adjustment of AC excitation voltage over an operating range. In some embodiments, AC excitation may be generated by a variable speed/voltage electro-mechanical generator (e.g., diesel powered). A generator may be operated with controlled speed and/or current parameters to supply a desired AC excitation to an LED-based light engine, such as the light engine 105 of FIG. 1, for example. In some implementations, AC excitation to the light engine may be provided using well-known solid state and/or electro-mechanical methods that may combine AC-DC rectification, DC-DC conversion (e.g., buck-boost, boost, buck, flyback), DC-AC inversion (e.g., half- or full-bridge, transformer coupled), and/or direct AC-AC conversion. Solid state switching techniques may use, for example, resonant (e.g., quasi-resonant, resonant), zero-cross (e.g., zero-current, zero-voltage) switching techniques, alone or in combination with appropriate modulation strategies (e.g., pulse density, pulse width, pulse-skipping, demand, or the like).

This document discloses technology relating to architecture for high power factor and low harmonic distortion of LED lighting systems. Related examples may be found in previously-filed disclosures that have common inventorship with this disclosure.

Examples of technology for dimming and color-shifting LEDs with AC excitation are described with reference, for example, to the various figures of U.S. Provisional Patent Application entitled "Color Temperature Shift Control for Dimmable AC LED Lighting," Ser. No. 61/234,094, which was filed by Z. Grajcar on Aug. 14, 2009, the entire contents of which are incorporated herein by reference.

Examples of technology for improved power factor and reduced harmonic distortion for color-shifting LED lighting under AC excitation are described with reference, for example, to FIGS. 20A-20C of U.S. Provisional Patent Application entitled "Reduction of Harmonic Distortion for LED Loads," Ser. No. 61/233,829, which was filed by Z. Grajcar on Aug. 14, 2009, the entire contents of which are incorporated herein by reference.

Examples of LED-based light fixtures, such as the fixture 100 of FIG. 1, are described with reference, for example, to FIGS. 1-5 of U.S. Design Patent Application entitled "LED Downlight Assembly," Ser. No. 29/345,833, which was filed by Z. Grajcar on Oct. 22, 2009; FIGS. 1-3 of U.S. Design Patent Application entitled "LED Downlight with Trim," Ser. No. 29/345,852, which was filed by Z. Grajcar on Oct. 22, 2009; or, FIGS. 1-3 of U.S. Design Patent Application entitled "LED Downlight with Trim and Spacers," Ser. No. 29/345,851, which was filed by Z. Grajcar on Oct. 22, 2009. The entire disclosure of Ser. Nos. 29/345,833, 29/345,852 and 29/345,851 are each incorporated herein by reference.

Although some embodiments may advantageously smoothly transition the light fixture output color from a cool color to a warm color as the AC excitation supplied to the light engine 105 is reduced, other implementations are possible. For example, reducing AC input excitation may shift color temperature of an LED fixture from a relatively warm color to a relatively cool color, for example.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A method of electrically exciting a light engine, the method comprising:
processing a periodic waveform of alternating polarity to form an input excitation signal with a voltage amplitude reduced to substantially zero for a first portion of a periodic cycle of the periodic waveform;
providing a network of light emitting diodes (LEDs) comprising a first group of LEDs arranged in series connection with a second group of LEDs;
applying the input excitation signal to the network of LEDs;
diverting current away from the second group of LEDs in response to the input excitation signal voltage being less than an effective forward voltage of the network of LEDs; and
delaying conduction of current through the first or second groups of LEDs for a second portion of the periodic cycle of the periodic waveform longer than the first portion to produce a corresponding decrease in an average luminance of the first group of LEDs while maintaining a substantially constant luminance of the second group of LEDs.

2. The method of claim 1, further comprising delaying conduction for the second portion of the periodic cycle in response to an analog control signal.

3. The method of claim 2, wherein processing the periodic waveform of alternating polarity to form an input excitation signal with a voltage amplitude reduced to substantially zero for the first portion of the periodic cycle further comprises:
receiving a control signal and,
in response to information contained in the control signal, reducing the voltage amplitude of the input excitation signal to zero only during a portion of the period of the excitation voltage waveform that corresponds to the information in the control signal.

4. The method of claim 3, wherein reducing the voltage amplitude of the input excitation signal to zero only during a portion of the period of the excitation voltage waveform that corresponds to the information contained in the control signal comprises:
delaying application of the periodic waveform to the network of LEDs during at least one of the periods of the periodic waveform,
wherein a length of the delay is responsive to the information contained in the control signal.

5. The method of claim 3, wherein reducing the voltage amplitude of the input excitation signal to zero only during a portion of the period of the excitation voltage waveform that corresponds to the information contained in the control signal comprises:
advancing reduction of the excitation voltage signal to zero during at least one of the periods of the periodic waveform,
wherein a length of the advance is responsive to the information contained in the control signal.

6. The method of claim 1, wherein a current through the second group of LEDs exhibits a characteristic shape of a substantially sinusoidal waveform shape when the input excitation voltage exceeds the effective forward voltage threshold of the network of LEDs.

7. The method of claim 2, wherein the substantially periodic waveform of alternating polarity comprises a substantially sinusoidal voltage waveform.

8. The method of claim 1, wherein processing the periodic waveform of alternating polarity to form the input excitation signal with a voltage amplitude reduced to substantially zero for the first portion of the periodic cycle further comprises:
providing a phase-cut modulator configured to reduce a length of the first portion of the periodic cycle of the periodic waveform of alternating polarity in response to a control input signal.

9. The method of claim 7, wherein the control input signal comprises a single analog signal.

10. The method of claim 1, wherein processing the periodic waveform of alternating polarity to form the input excitation signal further comprises:
rectifying the periodic waveform of alternating polarity to form a waveform having unidirectional polarity.

11. The method of claim 1, wherein the first group of LEDs comprises at least one LED having a substantially different spectral characteristic than any of the LEDs in the second group of LEDs.

12. The method of claim 1, wherein the second group of LEDs comprises at least one LED having a substantially different spectral characteristic than any of the LEDs in the first group of LEDs.

13. The method of claim 6, further comprising providing one or more resistors in series with the second group of LEDs to control a peak current amplitude through the network of LEDs.

14. An illumination system comprising:
a phase control input port to receive an input control signal;
a phase-cut module coupled to the phase control input port and configured to process a periodic waveform of alternating polarity to form an input excitation signal with a voltage amplitude reduced to substantially zero for a first portion of a periodic cycle of the periodic waveform selected in response to the input control signal;
a rectifier for converting the input excitation signal to a unipolar voltage signal;
a network of light emitting diodes (LEDs) coupled to receive the input excitation signal from the rectifier, the network of LEDs comprising a first group of LEDs arranged in series connection with a second group of LEDs; and
a bypass module to divert current away from the second group of LEDs in response to the input excitation signal voltage greater than an effective forward voltage of the first group of LEDs and less than an effective forward voltage of the network of LEDs;
wherein a luminance of the first group of LEDs decreases in substantial correspondence with the input control signal while the second group of LEDs maintains a substantially constant luminance when conduction of current through the first or second groups of LEDs is delayed for a second portion of the periodic cycle of the periodic waveform longer than the first portion.

15. The system of claim 14, wherein the phase-cut module reduces the voltage amplitude of the input excitation signal to zero only during a portion of the period of the excitation voltage waveform that corresponds to information contained in the control signal.

16. The system of claim 15, wherein the phase-cut module delays application of the periodic waveform to the network of LEDs during at least one of the periods of the periodic waveform, wherein a length of the delay is responsive to the information contained in the control signal.

17. The system of claim 14, wherein the network of LEDs are configured as a module with terminals for making connection to the bypass module.

18. The system of claim 15, wherein the phase-cut module advances reduction of the excitation voltage signal to zero during at least one of the periods of the periodic waveform, wherein a length of the advance is responsive to the information contained in the control signal.

* * * * *